United States Patent [19]
Miller

[11] Patent Number: 5,939,863
[45] Date of Patent: Aug. 17, 1999

[54] POWER CIRCUIT PROVIDING REVERSE BATTERY PROTECTION AND CURRENT AND TEMPERATURE SENSING

[75] Inventor: Roger Miller, Palos Verdes Estates, Calif.

[73] Assignee: International Rectifier Corp., El Segundo, Calif.

[21] Appl. No.: 09/016,043

[22] Filed: Jan. 30, 1998

Related U.S. Application Data

[60] Provisional application No. 60/036,019, Jan. 31, 1997, and provisional application No. 60/059,025, Sep. 16, 1997.

[51] Int. Cl.$^6$ .................................................. H01M 10/46
[52] U.S. Cl. ............................................................... 320/136
[58] Field of Search .................................... 320/134, 136, 320/144, 150, 153, 154, FOR 134; 361/245, 246, 84

[56] References Cited

U.S. PATENT DOCUMENTS

| | | | |
|---|---|---|---|
| 4,654,568 | 3/1987 | Mansmann | 318/293 |
| 4,857,985 | 8/1989 | Miller | 357/42 |
| 4,958,251 | 9/1990 | Cini et al. | 361/84 |
| 4,972,136 | 11/1990 | Banura | 323/275 |
| 5,012,381 | 4/1991 | Elliott et al. | 361/84 |
| 5,027,250 | 6/1991 | Cini et al. | 361/90 |
| 5,126,911 | 6/1992 | Contiero et al. | 361/84 |
| 5,410,441 | 4/1995 | Allman | 361/18 |
| 5,434,739 | 7/1995 | Heck | 361/84 |
| 5,451,806 | 9/1995 | Davies | 257/370 |
| 5,495,155 | 2/1996 | Juzswik et al. | 318/293 |
| 5,517,379 | 5/1996 | Williams et al. | 361/84 |
| 5,519,557 | 5/1996 | Kopera, Jr. et al. | 361/84 |
| 5,539,610 | 7/1996 | Williams et al. | 361/246 |
| 5,546,264 | 8/1996 | Williamson et al. | 361/84 |
| 5,642,251 | 6/1997 | Lebbolo et al. | 361/84 |
| 5,648,739 | 7/1997 | Walther et al. | 327/330 |
| 5,670,867 | 9/1997 | Mitsuda | 323/312 |

*Primary Examiner*—Edward H. Tso
*Attorney, Agent, or Firm*—Ostrolenk, Faber, Gerb & Soffen, LLP

[57] ABSTRACT

A power circuit having a reverse battery protection feature, a current sensing feature and a temperature sensing feature employs a MOS gated power semiconductor device or other resistive device in the forward current path of a power stage. An information converting device converts analog information indicative of at least one of the current flowing through the resistive device and a signal from a temperature sensing device into a digital signal for delivery to a microprocessor.

22 Claims, 4 Drawing Sheets

POWER CIRCUIT PROVIDING REVERSE BATTERY PROTECTION AND CURRENT AND TEMPERATURE SENSING

CROSS REFERENCE TO RELATED APPLICATION

This application is related to United States Provisional patent application Ser. No. 60/036,019 filed Jan. 31, 1997 entitled BATTERY PROTECTION, CURRENT SENSE, AND TEMPERATURE MONITOR CIRCUIT, Attorney Docket No. EAR 1434 (PROV) (2-1438), and to United States Provisional patent application Ser. No. 60/059,025 filed Sep. 16, 1997 entitled VOLTAGE MONITOR FOR REVERSE BATTERY PROTECTION CURRENT SENSE, AND TEMPERATURE SENSE CIRCUIT.

BACKGROUND OF THE INVENTION

1. Field of the Invention

The present invention relates to reverse battery protection, current sense, and temperature sense circuits and, more particularly, to a novel circuit for performing all three functions and producing a digital output thereof.

2. Related Art

Conventional power circuits which are connected to a battery (for example and automotive battery) utilize an electromechanical relay and diode combination to protect the power circuit from damage due to reverse battery connections. Current sensing in conventional power circuits is generally accomplished using a shunt resistor.

A conventional power circuit 10, as is used in the automotive industry, is shown in FIG. 1. The power circuit 10 includes a positive DC bus (B+) and a ground terminal for connection to a battery (not shown). Six power transistors, Q1–Q6, form a full bridge circuit for driving, for example, a three phase induction motor. Gate drive control circuits 11, 12, and 13 alternately turn on and off the power transistors Q1–Q6 to produce pulsed power at terminals A, B and C as is known in the art.

A relay circuit, M, is employed to protect the power transistors from damage if the battery is connected in reverse. When the battery is reversed, diode D1 is reverse biased so that current is blocked from flowing through the relay coil. The relay contact then opens to disconnect the battery from the power circuit 10. When, the battery is connected properly, forward current flows through diode D1 and the relay coil such that the relay contact closes and the power circuit is energized by the battery at B$^+$ to ground.

Current sensing in the conventional power circuit 10 of FIG. 1 is accomplished by sensing the voltage across a shunt resistor R1 as is well known in the art. Temperature sensing in the conventional power circuit 10 is not possible without providing an additional temperature sensing component, for example, a thermocouple, a thermistor or the like.

The conventional power circuit 10 of FIG. 1 is disadvantageous because in the automotive industry information from current sensing and temperature sensing is typically input to a microprocessor or the like in the form of digital information for use by the microprocessor in controlling of the overall operation of the automobile.

Accordingly, there is a need in the art for an inexpensive solution to providing reverse battery protection, current sensing and temperature sensing in a power circuit which employs a minimal number of circuit components and provides a digital interface for delivering the current and temperature information to a micro-processor.

SUMMARY OF THE INVENTION

In order to overcome the disadvantages of the prior art power circuits which employ conventional reverse battery protection circuits, current sensing circuits and temperature sensing circuits, the present invention employs a power semiconductor device preferably a MOS gated device such as a power MOSFET or IGBT in the forward current path of a power stage for providing reverse battery protection, current sensing, and temperature sensing capabilities. The gate of the power semiconductor device is coupled to the positive bus terminal of the circuit and is alternately coupled to ground when the temperature is to be monitored.

According to another aspect of the invention, an information converting device is employed which is adapted to convert an analog signal indicative of at least one of the current flowing through a current sensing element and a temperature signal produced by a temperature sensing element into digital information for delivering to a microprocessor.

Other features and advantages of the present invention will become apparent from the following description of the invention which refers to the accompanying drawings.

BRIEF DESCRIPTION OF THE DRAWING(S)

For the purpose of illustrating the invention, there is shown in the drawing a form which is presently preferred, it being understood, however, that the invention is not limited to the precise arrangement and instrumentality shown.

DETAILED DESCRIPTION OF THE INVENTION

Figure 1:
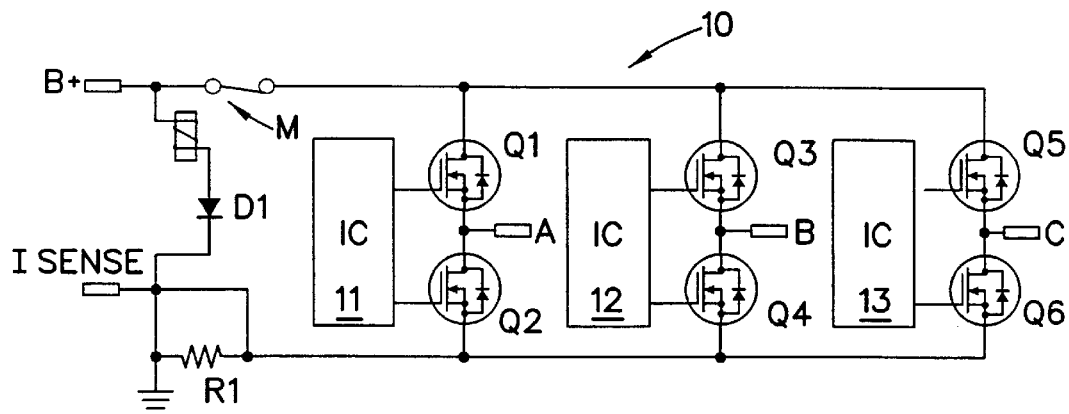
FIG. 1 is a schematic diagram of a prior art power circuit employing reverse battery protection and current sensing circuitry.
Figure 2:
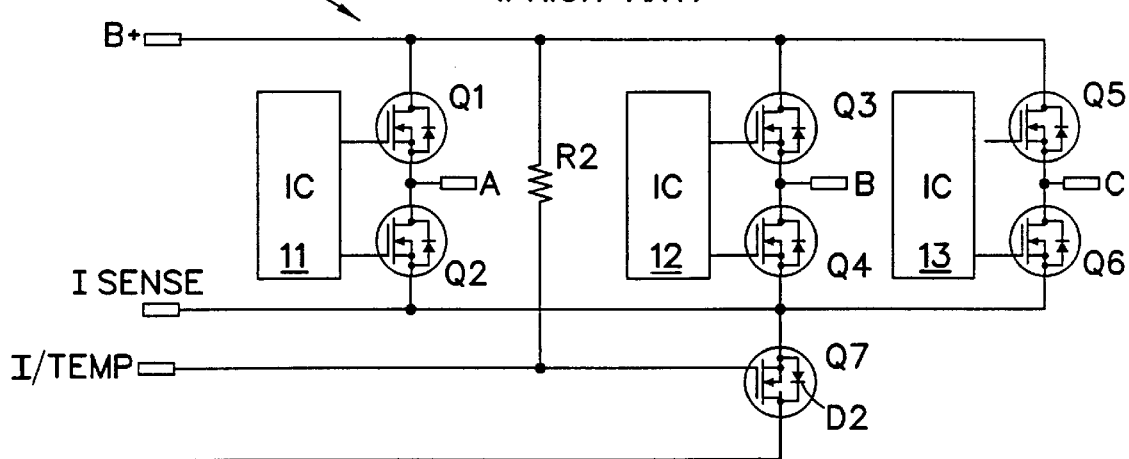
FIG. 2 is a schematic diagram of a power circuit employing reverse battery protection, current sense and temperature sense circuitry in accordance with an embodiment of the present invention.

Referring now to the drawings wherein like numerals indicate like elements, there is shown in FIG. 2 a power circuit 100 having a configuration in accordance with a first embodiment of the present invention. The power circuit 100 of FIG. 2 has a power stage similar to that of FIG. 1 but employs a unique reverse battery protection circuit which may also provide current sensing and temperature sensing capabilities.

The power circuit 100 includes an N-channel vertical conduction power MOSFET Q7 connected in series with the forward current path of the power stage to ground. It is noted that any power semiconductor device having a body diode in the proper orientation may be used, for example, a P-channel vertical conduction power MOSFET can be used if the body diode is reversed. Specifically, the source of Q7 is connected to the common source node of the full bridge which has a terminal labeled I SENSE. The drain of Q7 is connected to ground. Thus, the inherent body diode of the MOSFET Q7 is oriented such that its cathode is also coupled to ground and its anode is coupled to the I SENSE terminal.

The gate of Q7 (having a terminal labeled I/TEMP) is coupled to the B+ bus of the power circuit 100 through a bias resistor R2. When the battery (not shown) is properly connected to the B+ terminal, the gate of Q7 is biased to a voltage above the source and Q7 turns on. In an automotive application, the gate is biased to a voltage of about 12 volts. Accordingly, Q7 conducts current from the power stage of the power circuit 100 to ground and the power circuit to terminals A, B and C is complete. However, if the battery is connected in a reverse orientation, the gate of Q7 will not be at a voltage potential above that of the source and Q7 will remain off thereby conducting no current and protecting, inter alia, the power transistors Q1–Q7 and the control circuits 11, 12, and 13. Advantageously, the diode and relay combination (D1, M) of the prior art reverse battery protection circuit is not required in the circuit of the present invention.

When Q7 is biased on, the current flowing therethrough may be detected by sensing the forward voltage drop from source to drain (i.e., the voltage from I SENSE to ground). Since the current flowing through Q7 is the same as the aggregate current flowing through the power stage, the voltage sensed on the I SENSE terminal is an accurate measure of the current of the power circuit 100. Advantageously, the additional shunt resistor (R1) of the prior art current sensing circuit is not required in the circuit of the present invention.

In the conventional assembly of the power circuit 100, devices $Q_1$ to $Q_6$ are thermally coupled to a common heat sink. Device $Q_7$ may be coupled to the same heat sink. When the gate of Q7 (the I/TEMP terminal) is connected to ground, the characteristics of the body diode, D2, are used to sense the temperature of Q7 which also provides an accurate measure of the operating temperature of the power circuit 100. It is noted that the I/TEMP terminal should be connected to ground synchronously with the bridge circuit being turned off. Typically, the forward voltage drop of the body diode decreases by about 2 mV for every 1° C. rise in temperature (at a constant forward current). Therefore, the voltage at the I SENSE terminal is measured when the I/TEMP terminal is coupled to ground to obtain the temperature of the power circuit 100.

Advantageously, using the novel configuration of the present invention, reverse battery protection, current sensing and temperature sensing is accomplished in a power circuit using a minimal number of components. Thus, the present invention provides improved functionality of the prior art power circuits at a minimal cost.

Figure 3:
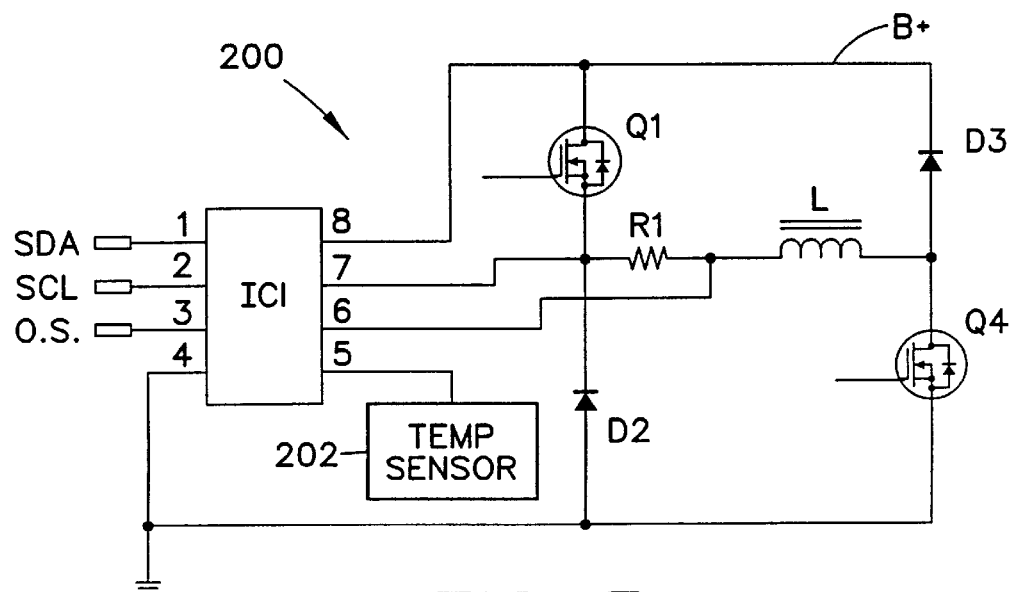
FIG. 3 is a schematic diagram of a power circuit employing current sense circuitry in accordance with another embodiment of the present invention.

Referring now to FIG. 3, a second embodiment of the present invention is shown.

The circuit of FIG. 3 shows a full bridge transistor network coupled across the positive DC bus B+ to ground. It is understood that the full bridge includes four transistors Q1 through Q4, for example MOSFET power transistors, where as shown transistors Q1 and Q4 are off and diodes D2 and D3 are free-wheeling such that current is flowing from ground through inductor L back to bus B+. Thus, diodes D2 and D3 represent the antiparallel diodes, for example, Schottky diodes, which are coupled across MOSFET transistors Q2 and Q3 (not shown).

Power circuit 200 includes a current sensing resistor R1 (a shunt resistor) coupled in series with the output inductor L such that the inductor L receives output current from the bridge and resistor R1 provides an output voltage corresponding to the current delivered to the inductor L. Such a configuration is particularly suited to driving a switch reluctance motor from a single ended power supply, for example, in an automotive application.

Power circuit 200 also includes integrated circuit IC 1 which, as shown, is an eight pin dual in line package, it being understood that the particular style package is not critical to the invention. IC 1 receives analog information corresponding to the current delivered to the inductor L vis-a-vis the voltage produced across resistor R1. The analog voltage appearing across resistor R1 is input to IC 1 via pins 7 and 6. IC 1 converts the analog voltage input on pins 7 and 6 to a digital bit stream, preferably a serial digital bit stream, and outputs the digital data on pin 1 (terminal SDA). IC 1 receives a clock signal on pin 2 (terminal SCL). The SDA and SCL interface is particularly suited to the automotive industry and is suitable to provide signals according to the $I^2C$ standard. IC 1 may optionally provide a signal on pin 3 (terminal O.S.) when the analog voltage presented between pins 7 and 6 exceeds a predetermined limit.

Power circuit 200 also includes a temperature sensor 202 which, for example, may include a thermistor, thermocouple, or the like, which temperature sensor is coupled to IC 1 via pin 5. The temperature sensor 202 is preferably thermally coupled to the power components Q1 through Q4 such that the temperature sensor provides an analog signal which is an accurate representation of the temperature of the power components. IC 1 converts the analog signal provided from the temperature sensor 202 to a digital signal for output to the SDA terminal. Thus, a microprocessor coupled to the digital interface (i.e., the SDA and SCL terminals) may receive current and temperature characteristics of the power circuit 200.

Figure 4:
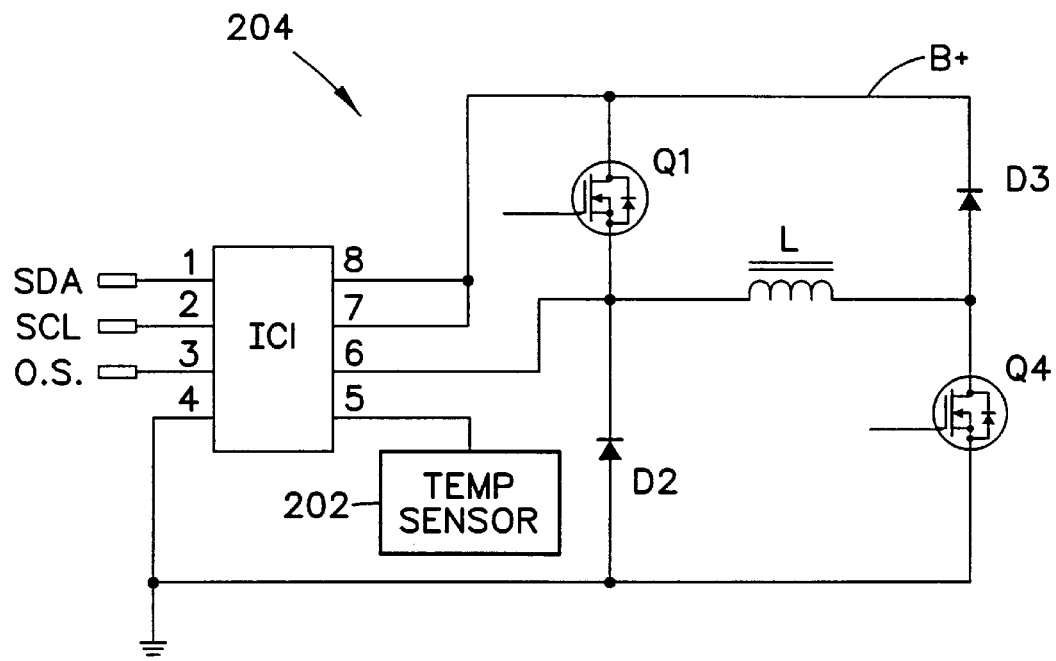
FIG. 4 is a schematic diagram of a power circuit employing current sense circuitry in accordance with still another embodiment of the present invention.

With reference to FIG. 4, a third embodiment of the present invention which includes a power circuit 204 is shown. The power circuit 204 is substantially the same as the power circuit of FIG. 3 but does not include a current sensing resistor R1 in series with the inductor L. Instead, the power circuit 204 utilizes the on resistance of the high side transistor Q1 to measure the current delivered to inductor L. Indeed, as the current delivered to inductor L increases, the voltage across transistor Q1 also increases. Thus, pins 7 and 6 of IC 1 are connected across transistor Q1 such that the voltage across transistor Q1 is input to IC 1 and utilized as the analog signal representative of the current delivered to inductor L.

It is understood that the voltage across transistor Q1 represents the current flowing through inductor L only when transistor Q1 is biased on by a control circuit (not shown). When transistor Q1 is biased off and diodes D2 and D3 of transistors Q2 and Q3, respectively, are free-wheeling, then the voltage across transistor Q1 substantially represents the voltage across the inductor L. Thus, if desired, IC 1 may provide a digital signal to the SDA terminal indicative of the voltage across inductor L.

Figure 5:
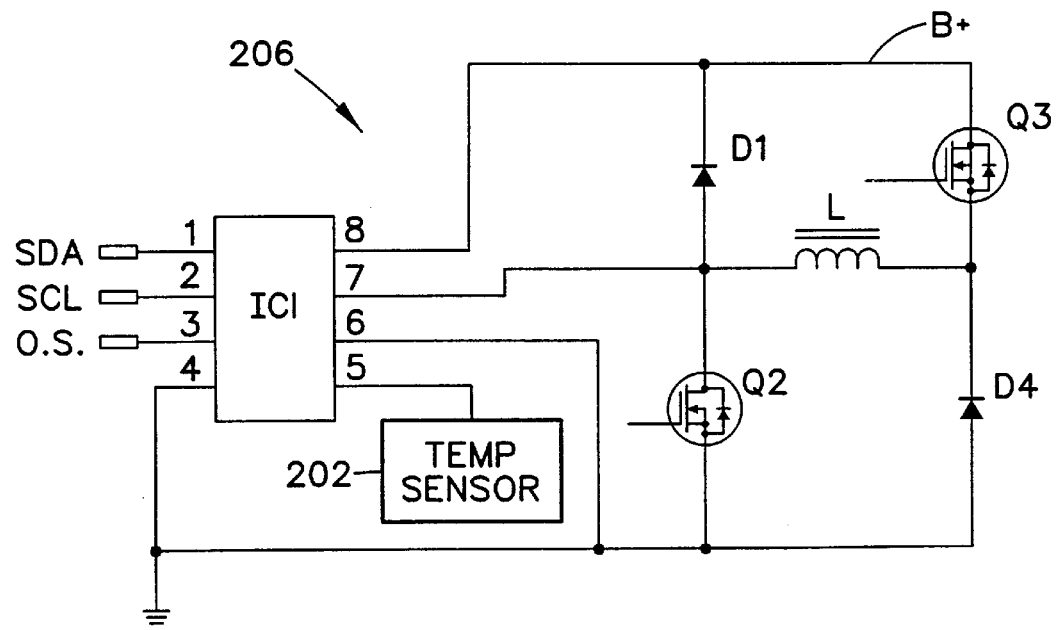
FIG. 5 is a schematic diagram of a power circuit employing current sense circuitry in accordance with yet another embodiment of the present invention.

Reference is now made to FIG. 5 which shows a fourth embodiment of the present invention employing a power circuit 206. Power circuit 206 is substantially the same as power circuit 204 except that the on resistance of transistor Q2 is utilized as a current sensing resistor and, therefore, pins 7 and 6 of IC 1 are coupled across transistor Q2. It is understood that diodes D1 and D4 represent the antiparallel diodes connected across transistors Q1 and Q4, respectively, and that diodes D1 and D4 are free-wheeling such that current is flowing from ground through diode D4, inductor L, diode D1 to the B+ bus. As was the case for the power circuit 204 of FIG. 4, IC 1 receives a voltage across pins 7 and 6 representative of the current flowing through inductor L when transistor Q2 is on and conducting current.

Figure 6:
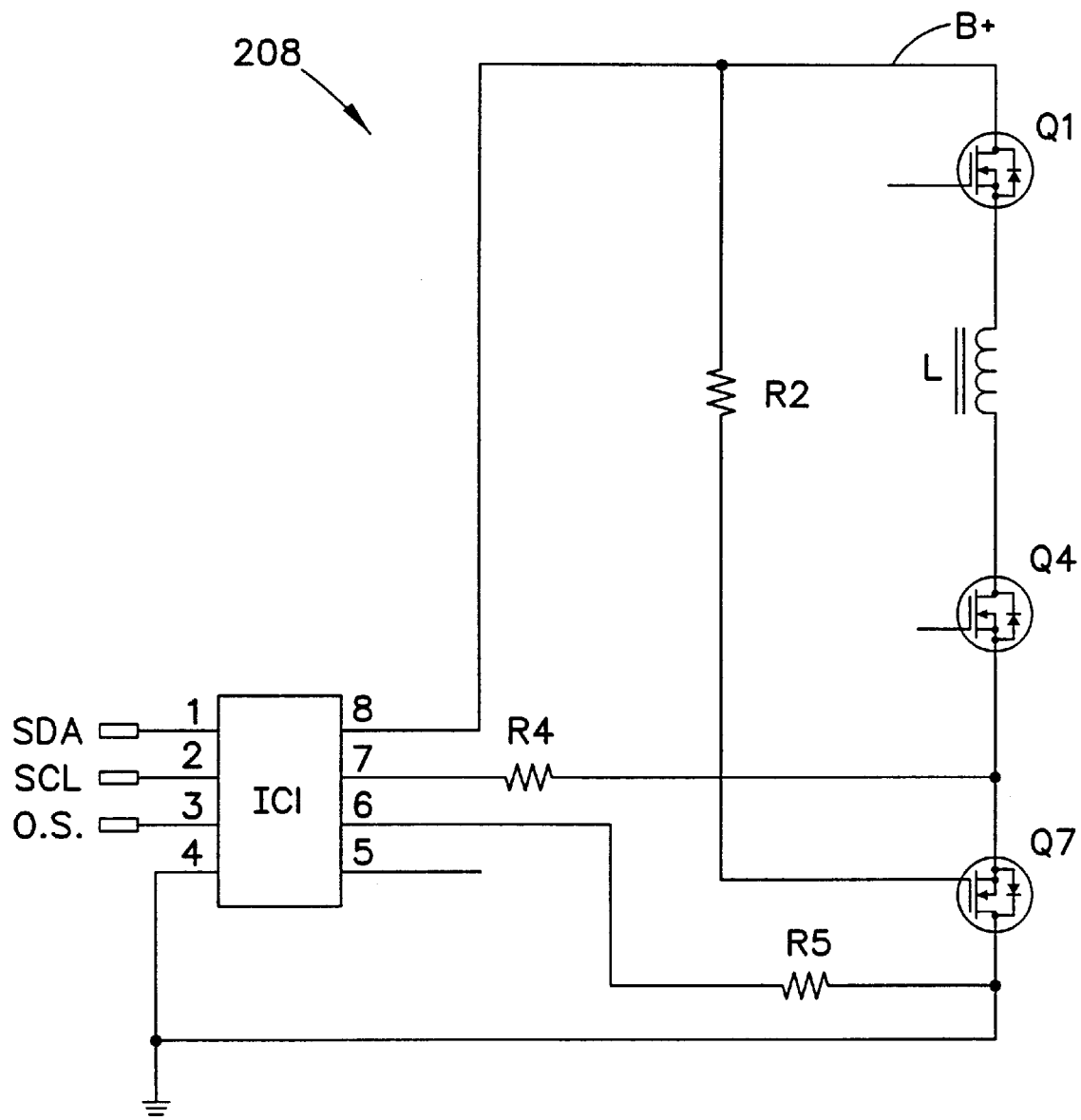
FIG. 6 is a schematic diagram of a power circuit employing reverse battery protection, current sense circuitry and temperature sense circuitry in accordance with the present invention.

Reference is now made to FIG. 6 which shows a schematic diagram of a fifth embodiment of the present invention employing a power circuit 208. Power circuit 208 includes transistors Q1 and Q4 coupled to inductor L. It is understood that inductor L may represent one phase of a multi-phase switch reluctance motor and that additional switching power components, such as transistors Q2 and Q3, are omitted for clarity. Power circuit 208 includes MOSFET Q7 coupled in series with the power components Q1 and Q4 to ground such that any current flowing through the power components and the inductor L flows through transistor Q7. Thus, as was the case for the power circuit 100 of FIG. 2, transistor Q7 may be utilized to sense both current and temperature as well as providing reverse battery protection.

Pins 7 and 6 of IC 1 are coupled across transistor Q7 via resistors R4 and R5, which resistors may provide Kelvin sensing. Thus, when transistor Q7 is biased on, the voltage across pins 7 and 6 of IC 1 is a voltage representative of the current flowing through L. When transistor Q7 is turned off, current flows through the antiparallel diode of transistor Q7 which produces a voltage across pins 7 and 6 of IC 1 representative of the temperature of the power components of power circuit 208. Accordingly, IC 1 produces a digital signal at terminal SDA which is indicative of both current and temperature. Further, IC 1 is adapted to provide a signal on terminal O.S. which is indicative of at least one of an over current or over temperature condition.

Advantageously, IC 1 provides a digital interface suitable for the I²C standard for the automotive industry which permits a microprocessor or other processing device in, for example, an automobile application, to receive certain characteristics of a power circuit in the automobile, namely, the current and temperature values for the power circuit. Thus, the microprocessor may take remedial action when the current and/or temperature of the power circuit are outside predetermined limits.

Figure 7:
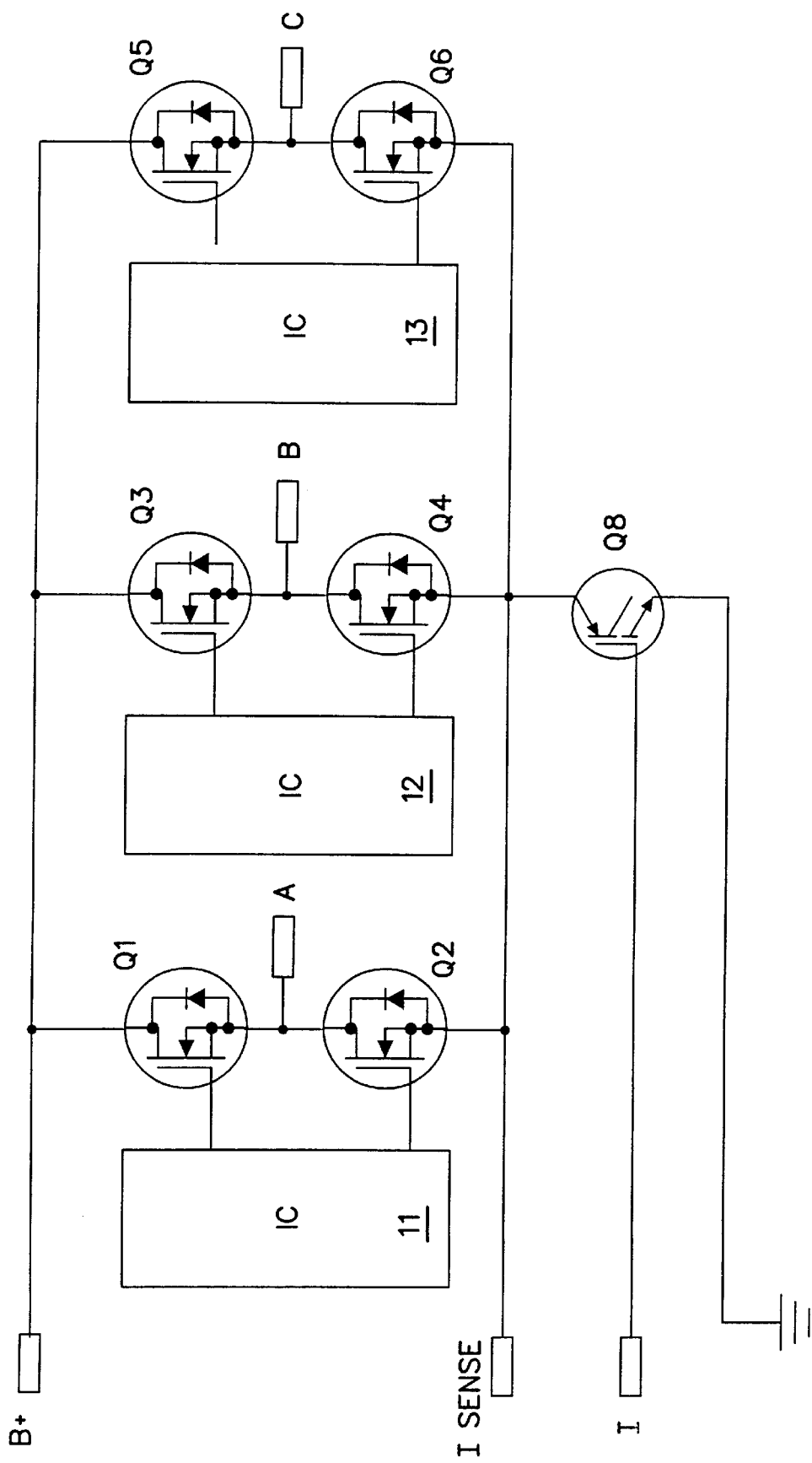
FIG. 7 is a schematic diagram of a power circuit employing reverse battery protection and current sense circuitry in accordance with an alternate embodiment of the present invention.

Referring now to FIG. 7, an alternate embodiment of the present invention is shown. Specifically, the MOSFET Q7 has been replaced with an IGBT, Q8, to provide both the reverse battery protection and current sensing features of the circuit of FIG. 2. It is noted that the circuit of FIG. 7 does not provide a temperature sensing feature because the IGBT does not have a body diode therein.

Although the present invention has been described in relation to particular embodiments thereof, many other variations and modifications and other uses will become apparent to those skilled in the art. It is preferred, therefore, that the present invention not be limited by the specific disclosure herein.

What is claimed is:

1. A power circuit having a positive input terminal and a ground terminal, the power circuit comprising:

a driving circuit coupled to the positive input terminal;

a power semiconductor device having a body diode, a source, a drain and a gate, the source being coupled to the driving circuit, the drain being coupled to the ground terminal and a gate coupled to the positive input terminal, wherein when a reverse voltage is applied to the positive input terminal, the power semiconductor device does not conduct current and no power is applied to the driving circuit;

a current sensing terminal coupled to the source, wherein the voltage from the current sensing terminal to the ground terminal measures the current flowing through the power circuit; and a temperature terminal coupled to the gate, wherein when said temperature terminal is coupled to the ground terminal and the driving circuit is turned off, the voltage from the current sensing terminal to the ground terminal measures the voltage drop of the body diode which is representative of the temperature thereof.

2. A power circuit as recited in claim 1, wherein the power semiconductor device is a MOSFET.

3. A power circuit as recited in claim 1, wherein the driving circuit is a full bridge circuit having a common source node and wherein the source of the power semiconductor device is coupled to the common source node.

4. A power circuit as recited in claim 1, wherein the driving circuit includes control circuits and power transistors.

5. A power circuit as recited in claim 1, wherein the power circuit is coupled to an automobile battery.

6. A power circuit having a positive input terminal and a ground terminal, the power circuit delivering power to an inductive load, the power circuit comprising:

a driving circuit coupled to the positive input terminal;

a current sensing resistor coupled in series with the inductive load, wherein the analog voltage across the current sensing resistor measures the current provided by the power circuit to the inductive load;

an integrated circuit having input pins and output pins;

first and second current sense input pins of the integrated circuit coupled to the current sensing resistor to receive the analog voltage across the current sensing resistor; and a current sense output pin of the integrated circuit outputting a digital representation of the analog voltage received by the first and second current sense input pins.

7. A power circuit as recited in claim 6 further comprising:

a clock input pin of the integrated circuit for receiving a clock signal.

8. A power circuit as recited in claim 6 further comprising:

an alarm output pin of the integrated circuit, the alarm output pin outputting a signal when the analog voltage on the first and second current sense input pins exceeds a predetermined limit.

9. A power circuit as recited in claim 6, wherein said power circuit is coupled to a automobile battery.

10. A power circuit as recited in claim 6 further comprising:

a temperature sensor coupled to the driving circuit and outputting an analog voltage representing the temperature of the driving circuit;

a temperature input pin of the integrated circuit coupled to the temperature sensor and receiving the analog voltage output by the temperature sensor; and a temperature output pin of the integrated circuit outputting a digital representation of the analog voltage received by the temperature input pin.

11. A power circuit as recited in claim 10, wherein the current sense output pin is the temperature output pin.

12. A power circuit having a positive input terminal and a ground terminal, the power circuit delivering power to an inductive load, the power circuit comprising:

a driving circuit coupled to the positive input terminal, the driving circuit including a plurality of power transistors;

at least one of the power transistors coupled to the inductive load, wherein the analog voltage across the at least one power transistor measures the current provided by the power circuit to the inductive load;

an integrated circuit having input pins and output pins;

first and second current sense input pins of the integrated circuit coupled to the at least one power transistor to receive the analog voltage across the at least one power transistor; and a current sense output pin of the integrated circuit outputting a digital representation of the analog voltage received by the first and second current sense input pins.

13. A power circuit as recited in claim 12 further comprising:

a clock input pin of the integrated circuit for receiving a clock signal.

14. A power circuit as recited in claim 12 further comprising:

an alarm output pin of the integrated circuit, the alarm output pin outputting a signal when the analog voltage on the first and second current sense input pins exceeds a predetermined limit.

15. A power circuit as recited in claim 12 further comprising:

a temperature sensor coupled to the driving circuit and outputting an analog voltage representing the temperature of the driving circuit;

a temperature input pin of the integrated circuit coupled to the temperature sensor and receiving the analog voltage output by the temperature sensor; and a temperature output pin of the integrated circuit outputting a digital representation of the analog voltage received by the temperature input pin.

16. A power circuit as recited in claim 12, wherein the power circuit is coupled to an automobile battery.

17. A power circuit as recited in claim 16, wherein said inductive load is a switch reluctance motor.

18. A power circuit having a positive input terminal and a ground terminal, the power circuit delivering power to an inductive load, the power circuit comprising:

a driving circuit coupled to the positive input terminal;

a power semiconductor device coupled in series with the inductive load wherein the current provided by the power circuit to the inductive load flows through the power semiconductor device, the power semiconductor device having a source coupled to the driving circuit, a drain coupled to the ground terminal and a gate coupled to the positive input terminal;

an integrated circuit having input pins and output pins;

first and second current sense input pins of the integrated circuit coupled to the power semiconductor device to receive the analog voltage across the power semiconductor device;

a current sense output pin of the integrated circuit outputting a digital representation of the analog voltage received by the first and second current sense input pins.

19. A power circuit as recited in claim 18, wherein the power semiconductor device is a MOSFET.

20. A power circuit as recited in claim 18, wherein the power semiconductor device further has a body diode, wherein when the power semiconductor device is turned off, current flows through the body diode and produces an analog voltage on the first and second current sense pins of the integrated circuit representative of the temperature of the power circuit, and wherein the current sense output pin of the integrated circuit outputs a digital representation of the temperature of the power circuit.

21. A power circuit having a positive input terminal and a ground terminal, the power circuit comprising:

a driving circuit coupled to the positive input terminal;

a power semiconductor device having a source, a drain and a gate, the source being coupled to the driving circuit, the drain being coupled to the ground connection and a gate coupled to the positive input terminal, wherein when a reverse voltage is applied to the positive input terminal, the power semiconductor device does not conduct current and no power is applied to the driving circuit; and a current sensing terminal coupled to the source wherein the voltage from the current sensing terminal to the ground terminal measures the current flowing through the power circuit.

22. A power circuit as recited in claim 21, wherein said power semiconductor device is an Insulated Gate Bipolar Transistor.

\* \* \* \* \*